United States Patent [19]

Cooper et al.

[11] 3,967,221

[45] June 29, 1976

[54] SURFACE ACOUSTIC WAVE DELAY LINE WITH BULK WAVE DISCRIMINATION

[75] Inventors: Herbert Warren Cooper, Hyattsville; John Acevedo, Linthicum, both of Md.; John deKlerk, Pittsburgh, Pa.

[73] Assignee: Westinghouse Electric Corporation, Pittsburgh, Pa.

[22] Filed: Jan. 24, 1974

[21] Appl. No.: 436,281

[52] U.S. Cl. .............................. 333/30 R; 310/8.1; 310/8.2; 310/9.5
[51] Int. Cl.² ..................... H03H 9/30; H03H 9/26; H01L 41/18; H01L 41/10
[58] Field of Search ................. 333/30 R, 72; 310/8, 310/8.1, 8.2, 9.8, 9.5

[56] References Cited
UNITED STATES PATENTS

| | | | |
|---|---|---|---|
| 3,568,102 | 3/1971 | Tseng | 333/30 R |
| 3,753,164 | 8/1973 | DeVries | 333/30 R |
| 3,771,072 | 11/1973 | Slobodnik, Jr. | 333/30 R |
| 3,772,618 | 11/1973 | Slobodnik, Jr. | 333/30 R |
| 3,883,831 | 5/1975 | Williamson et al. | 333/30 R |

OTHER PUBLICATIONS

Wiliamson et al.,--"Electronic Letters" vol. 8, No. 16, Aug. 10, 1972; pp. 401–402.

*Primary Examiner*—Alfred E. Smith
*Assistant Examiner*—Marvin Nussbaum
*Attorney, Agent, or Firm*—R. M. Trepp

[57] ABSTRACT

The disclosure relates to an acoustic surface wave device and method for long signal delays and bulk wave discrimination through the folding of a surface wave propagation path. A surface wave device is formed on the surface of an acoustic substrate and a surface wave, acoustic discontinuity is formed in the propagation path of surface waves propagated along the surface of the substrate. The acoustic discontinuity defines a reflecting surface for acoustic surface waves thereby deflecting incident surface waves along a reflecting path differing from the propagation path. Substantially all of the bulk waves propagated along the propagation path continue along this path and can be absorbed or otherwise dissipated. As a result, a substantially pure surface wave mode signal can be detected along the reflecting path. The surface waves may be reflected in this manner, i.e., by folding the path of the surface waves, a number of times as required to obtain a desired delay.

10 Claims, 2 Drawing Figures

SURFACE ACOUSTIC WAVE DELAY LINE WITH BULK WAVE DISCRIMINATION

BACKGROUND OF THE INVENTION

1. Field of the Invention

The present invention relates to acoustic surface wave devices and, more particularly, to an acoustic surface wave device and method in which an acoustic surface wave propagation path is folded through the use of an acoustic discontinuity in the surface of an acoustic substrate to thereby provide increased time delays and/or bulk wave discrimination.

2. State of the Prior Art

Acoustic surface wave devices have become exceedingly useful in a variety of systems as signal processing elements. For example, acoustic surface wave devices are particularly useful as signal filters and signal delay lines in various frequency ranges because of the flexibility of design characteristics of such devices.

Typical acoustic surface wave delay lines are fabricated on substrates of various materials depending upon the range of frequencies at which the delay line is designed to operate. In the higher frequency ranges on the order of hundreds and megahertz to gigahertz, crystalline materials are typically employed as the acoustic substrate. In the lower frequency ranges on the order of 10 to 30 megahertz, amorphous glasses, fused quartz, or steel strip substrates may be employed. To achieve long delays with acoustic surface wave delay lines, a surface wave is typically propagated along the surface of a moderate or low loss acoustic surface wave propagating substrate material in a single path which is long enough to provide the desired delay. Such single path structures may require a relatively large, one piece substrate for the long delay which may be encountered. Moreover, for delay lines of wide fractional bandwidth, the surface wave mode may overlap bulk wave modes at the optimum frequencies for generating surface waves with interdigital transducers. The surface wave and bulk wave modes usually propagate with different velocities and, in a surface device, the bulk wave modes thus represent spurious energy which may cause large non-linear delays.

OBJECTS AND SUMMARY OF THE INVENTION

It is accordingly an object of the present invention to provide a novel method and acoustic surface wave device which provides discrimination against undesired bulk wave modes.

It is another object of the invention to provide a novel method and acoustic surface wave device for achieving long signal delays through the folding of the surface wave propagation path.

It is yet another object of the invention to provide a novel method and acoustic surface wave device for achieving long signal delays and bulk wave mode discrimination through the folding of the surface wave propagation path by the selective reflection of surface waves with very little reflection of bulk waves.

These and other objects and advantages are accomplished in accordance with the present invention through the provision of a surface wave device formed on an acoustic substrate having an acoustic discontinuity at one surface thereof. The acoustic discontinuity defines a reflecting surface which extends beneath the substrate sufficiently to reflect a substantial amount of incident surface wave energy, propagated along the surface of the substrate without reflecting a substantial amount of bulk wave energy propagated through the substrate. Surface waves are launched along a first propagation path intersecting the reflecting surface defined by the acoustic discontinuity. The first propagation path preferably intersects the reflecting surface at an acute angle so that the surface waves are reflected along a second propagation path differing from the first path while most of the bulk wave energy continues past the reflecting surface along the first path. A suitable pickup or detector may be placed in the second path to detect the relatively pure, reflected surface wave mode.

DETAILED DESCRIPTION

Figure 1:
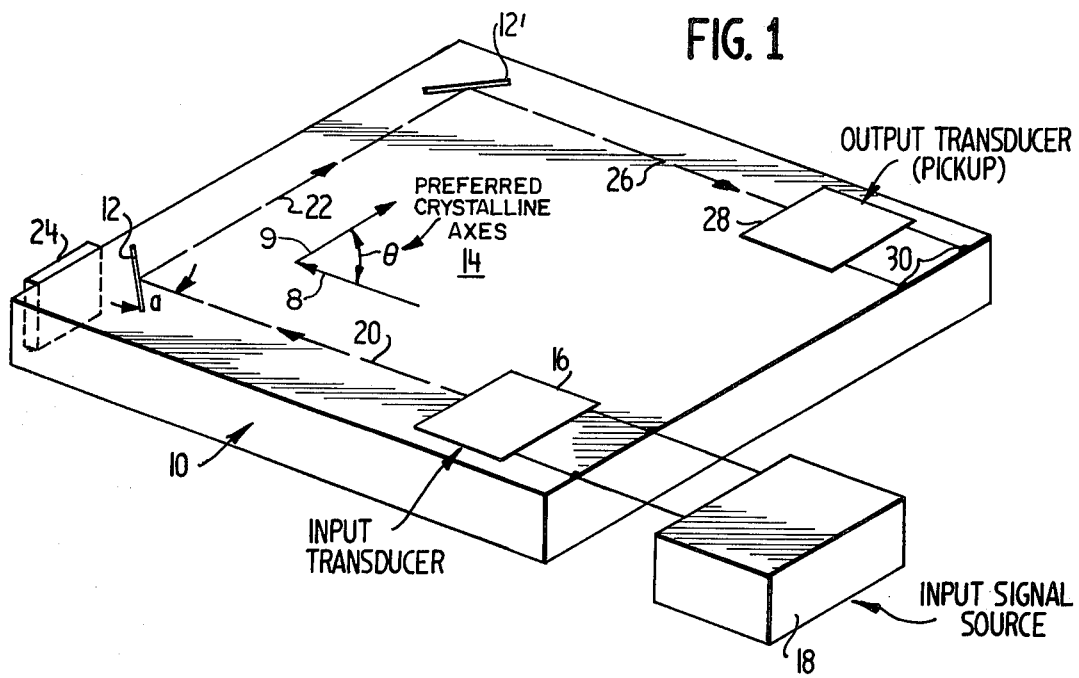
FIG. 1 is a pictorial, schematic representation of one embodiment of a surface wave device constructed in accordance with the present invention; and, FIG. 2 is a plan view schematically illustrating a variable tapped delay line constructed in accordance with the present invention.

Referring now to FIG. 1, a surface wave device according to the present invention may include a suitable acoustic substrate 10 having one or more acoustic discontinuities 12 and 12' in one surface 14 thereof. A suitable input transducer 16 may be energized by an input signal source 18 to launch acoustic surface waves along the surface of the substrate 14 in a propagation path generally indicated at 20.

The input transducer 16 may be any suitable conventional transducer such as a piezoelectric transducer or an interdigital transducer of the type disclosed in U.S. Pat. No. 3,611,203 assigned to the assignee of the present invention. As is described in the referenced patent, such an interdigital transducer launches surface waves with considerable directivity and can produce both surface and bulk waves in the acoustic substrate 10. In accordance with the present invention, the input transducer 16 is disposed on the surface 14 of the substrate 10 such that generated surface waves (and undesired bulk waves) propagate along the propagation path 20 and intersect the acoustic discontinuity 12 preferably at an acute angle a, i.e., an angle a less than 90°. The acoustic discontinuity 12 defines a reflecting surface which extends beneath the surface of the substrate sufficiently to reflect a substantial amount of incident surface wave energy propagated along the path 20 without reflecting a substantial amount of bulk wave energy propagated through the body of the substrate 10. The acoustic discontinuity 12 may be formed in the surface of the substrate 10 as will hereinafter be described.

Surface waves launched along the propagation path 20 strike the reflective surface defined by the acoustic discontinuity 12 and are reflected along a reflection path 22 which preferably differs from the propagation path 20. The major portion of bulk wave energy propagated along the path 20 is distributed through the body of the substrate 10 and passes beneath the reflecting surface defined by the acoustic discontinuity 12. A suitable bulk wave energy absorber 24 may be provided as is generally indicated in FIG. 1 to absorb the undesired bulk wave energy.

The surface wave energy reflected by the acoustic discontinuity 12 along the reflection path 22 may be again reflected by the acoustic discontinuity 12' along a second reflection path 26. A suitable output transducer 28 such as an interdigital transducer may be disposed in the reflection path 26 to detect the reflected surface waves and to provide an output signal representative thereof at output terminals generally indicated at 30. Of course, if a second reflection of the surface waves is not desired, there is no need for the second acoustic discontinuity 12' and the output transducer 28 may be disposed in the reflection path 22.

In operation, an electrical signal supplied from the input signal source 18 to the input transducer 16 generates surface waves which propagate along the propagation path 20. As was previously mentioned, undesirable bulk waves may also be produced. The surface waves strike the reflecting surface defined by the acoustic discontinuity 12 and are reflected along the reflection path 22.

If the device is to be employed for relatively short, highly accurate signal delays or for other applications in which bulk wave discrimination is the primary concern, the acoustic discontinuity 12 may extend beneath the surface 14 of the substrate 10 by an amount sufficient to reflect a substantial portion of the acoustic surface wave energy propagating along the path 20 without reflecting a substantial amount of bulk wave energy. Thus, most of the bulk wave energy will continue in the direction of the propagating path 20 beyond the acoustic discontinuity 12 and only relatively pure surface mode energy will be reflected along the reflection path 22.

If a relatively long signal delay is required, it may be necessary to fold the path of the surface wave energy through several reflections thereof. Under such circumstances, the acoustic discontinuity 12 and thus the reflecting surface defined thereby may necessarily extend beneath the surface 14 of the substrate 10 by a greater amount to insure that substantially all of the incident surface wave energy is reflected. Otherwise, there may be insufficient surface wave energy at the output transducer 28 to provide a useful output signal due to losses in the substrate material 10. Since most of the acoustic surface wave energy is propagated in the uppermost $\lambda/2$ of the substrate, the depth of the acoustic discontinuity may range from about $\lambda/2$ to several $\lambda$ (where $\lambda$ is an acoustic wavelength in the substrate) depending upon the particular application.

The transucers 16 and 28 and the acoustic discontinuities 12 defining the reflecting surfaces may be arranged in various ways to provide, for example, highly versatile acoustic surface wave delay lines. One such configuration is illustrated schematically in FIG. 2.

Figure 2:
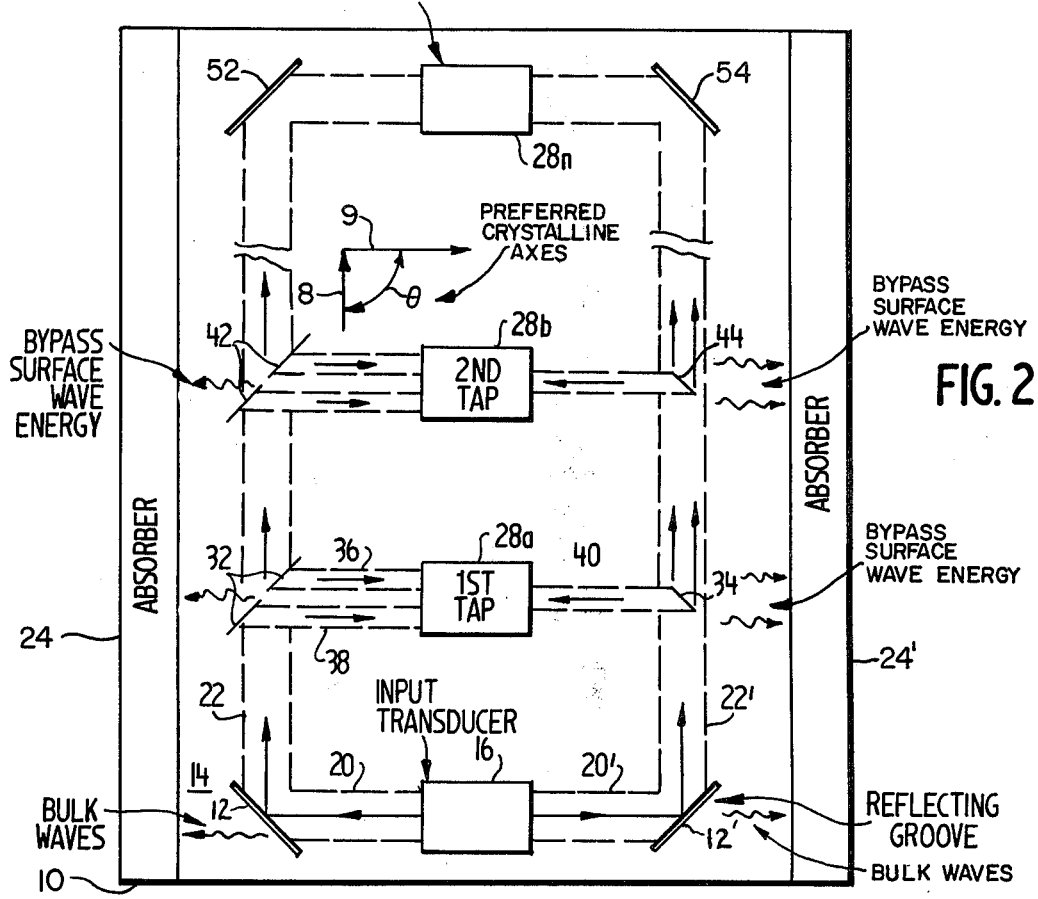

Referring now to FIG. 2, wherein like numerical designations have been utilized to designate elements previously described in connection with FIG. 1, the input transducer 16 may be disposed on the surface 14 of the substrate 10 to propagate wave energy along propagation paths 20 and 20'. A signal input transducer of the interdigital type may be utilized since interdigital transducers of the type disclosed in the referenced patent have bidirectional propagation characteristics.

Acoustic discontinuities 12 and 12' may be equidistantly spaced from the input transducer 16 in the propagation paths 20 and 20' to reflect surface waves along the respective reflection paths 22 and 22'. Suitable bulk wave absorbers 24 and 24' may be provided along the edges of the substrate 10 to absorb bulk waves passing beneath the reflecting surfaces defined by the acoustic discontinuities 12 and 12'. A portion of the surface wave energy propagated along the reflection paths 22 and 22' may again be reflected by acoustic discontinuities 32 and 34 disposed in the respective reflection paths 22 and 22'. The portion of surface wave energy reflected by the respective acoustic discontinuities 32 and 34 may be directed along reflection paths 36, 38 and 40 toward an output transducer 28a. Portions of the surface wave energy not reflected by the acoustic discontinuities 32 and 34 may continue along the respective reflection paths 22 and 22' toward additional reflecting surfaces defined by acoustic discontinuities 42 and 44, respectively, disposed in the respective paths 22 and 22'. The surface wave energy reflected by the acoustic discontinuities 42 and 44 may similarly be directed toward an output transducer 28b.

Additional acoustic discontinuities may be provided in the reflection paths 22 and 22' to direct surface wave energy toward additional output transducers 28c–28n at spaced intervals along the paths 22 and 22' as desired. Because the surface waves detected by each of the output transducers traverse different path lengths, each output transducer provides a different delay between the input signal and the output signal. The configuration of FIG. 2 thus provides a plurality of taps from which a variety of signal delays may be obtained.

To facilitate an understanding of the configuration of FIG. 2, it should be noted that surface waves generated by the input transducer 16 typically propagate along a path having some finite width W related to the size of the input transducer. Each acoustic discontinuity in the reflecting path 22 may be split, as illustrated, to reflect a substantial portion of the surface waves propagating along the edges of the reflection path 22 and to pass surface wave energy propagated centrally of the path 22. Each acoustic discontinuity disposed in the reflection path 22' may be of slightly less length than the width W of the reflection path 22' so that surface wave energy along the edges of the path continues along each acoustic discontinuity. Thus, for example, surface wave energy directed toward the output transducer 28a from the reflection paths 22 and 22' is detected and combined by the output transducers and that energy which continues beyond the output transducer 28a bypasses the reflectors formed by the acoustic discontinuity in the reflection paths.

Moreover, each succeeding acoustic discontinuity disposed in the reflection path 22 may be of slightly greater length than the previous one so that it will reflect some of the surface wave that was allowed to pass unreflected by the previous discontinuity. Similarly each succeeding acoustic discontinuity disposed in the reflection path 22' may be of slightly greater length than the previous one so that it will reflect some of the surface wave that was allowed to pass unreflected by the previous discontinuity. In this manner, surface wave energy is detected at different times by each of the detectors 28a–28n thereby providing a variable delay device.

The substrate 10 may be any suitable material preferably presenting a moderate or low loss propagation path to surface wave energy. If an amorphous material is utilized, the propagation paths and reflection paths may be oriented in any desired manner. However, with a crystalline material such as a silicon crystal, it is preferred that a propagation and reflection path be oriented along predetermined axes or directions in crystalline planes so that undesired mode conversion or surface wave to bulk wave conversion does not occur.

Accordingly, the choice of angle for the discontinuity with respect to the propagation paths may be selected so that the angle of incidence plus the angle of reflection will deflect the propagation of surface wave energy from one pure mode to another, i.e., from one crystalline axis or direction to another in the plane. Thus, for example, with a crystalline material having orthogonal crystalline axes or direction in a plane, the initial propagation path may be along one of the crystalline axes or direction and the reflecting surface formed by the acoustic discontinuity may be oriented at a 45° angle relative to the propagation path. Upon reflection, the surface waves will thus propagate along a reflection path which also coincides with a crysalline axis or direction in the plane.

For example, a piezoelectric transducer may be formed on a silicon substrate using materials such as zinc oxide. The angle between pure mode axes or directions in a plane in the silicon substrate may be on the order of 116° and thus, by orienting the transducer so that the direction of propagation is in one of the crystalline directions in the use of a 32° reflecting surface will change the direction of propagation of the energy to another crystalline direction in the plane resulting in pure mode propagation in both the crystalline directions in the plane with no undesired mode conversion. In other words, the surface waves are deflected a total of 64° so that the direction of propagation is in the axes or directions in the plane oriented at 116° relative to each other (i.e., 180° − 64° = 116°).

The acoustic discontinuities previously described may be formed in any suitable manner. For example, an acoustic discontinuity may be formed in the surface of most substrate materials by etching or otherwise forming a shallow groove in the surface of the substrate. Since the groove is a complete acoustic discontinuity and its sides form the reflecting surface, the orientation of the groove may be varied in accordance with the desired angle of reflection. The depth of the groove determines the depth of the acoustic discontinuity and since most of the surface wave energy is propagated in the upper $\lambda/2$ depth of the substrate, a groove of depth $\lambda$ or slightly greater will reflect most of the surface wave energy. Of course, for maximum reflection of surface waves the depth of the groove may be increased. However, the reflection requirements may be balanced against the bulk wave discrimination requirements of a particular application in determining the depth of the groove. Maximum discrimination against bulk waves, i.e., minimum reflection of bulk waves, will occur with a relatively shallow acoustic discontinuity.

Discontinuities in the propagation constant of a material other than a complete discontinuity provided by the above described reflecting grooves may also provide the necessary acoustic discontinuity for reflection. For example, the surface of the substrate may be loaded or stressed in a line along which it is desired to form the reflecting surface. This loading at the surface of the substrate changes the propagation constant of the material along the line of loading thereby providing an acoustic discontinuity along that line. The effect of the discontinuity on surface waves propagated along the surface of the substrate may be varied by varying the amount of loading.

The present invention may be embodied in other specific forms without departing from the spirit or essential characteristics thereof. The presently disclosed embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A surface wave device comprising:
   a substrate of a crystalline material having first and second crystalline axes generally coplanar with a surface of said substrate and oriented at a predetermined angle relative to each other;
   means for launching acoustic surface waves along said surface of said substrate generally parallel to one of said crystalline axes; and
   an acoustic discontinuity in and extending beneath said surface of said substrate spaced from said launching means for reflecting said launched surface waves at approximately said predetermined angle to thereby direct said launched surface waves along the other of said crystalline axes.

2. The device of claim 1 wherein said substrate is silicon material having said first and second crystalline axes.

3. The device of claim 1 wherein said predetermined angle is 90° and said reflecting surface is formed in said surface of said substrate by a groove in said surface oriented at approximately a 45° angle with respect to said crystalline axes.

4. The device of claim 1 wherein said launching means is operable to launch undesired acoustic bulk waves, said acoustic discontinuity being relatively transparent to bulk waves whereby substantially all of said launched bulk waves continue along a straight path past said acoustic discontinuity.

5. The device of claim 1 wherein said acoustic discontinuity is a discontinuity in the propagation constant of the acoustic substrate.

6. The device of claim 5 wherein said discontinuity in the propagation constant is formed by a stress along a line at the surface and extending beneath the surface of the substrate.

7. A surface wave device comprising:
   an acoustic substrate having a first surface with an acoustic discontinuity in and extending beneath said first surface, said acoustic discontinuity being a single groove with one side of said groove having a planar reflecting second surface operable to reflect acoustic surface waves incident upon said reflecting second surface;
   means for launching acoustic surface waves along said first surface of said substrate in a propagation path intersecting said reflecting second surface at an acute angle as measured in the first surface, said surface waves thereby being reflected along said first surface in a reflecting path differing from said propagation path; and,
   means disposed in said reflection path for detecting said surface waves reflected by said reflecting surface.

8. A surface wave device comprising:
   an acoustic substrate having an acoustic discontinuity in one surface thereof, said acoustic discontinuity defining a single surface wave reflecting surface extending beneath said one surface of said substrate sufficiently to reflect a substantial amount of incident surface wave energy propagated along said surface of said substrate without reflecting a substantial amount of bulk wave energy propagated through said substrate; and, means for launching acoustic surface waves along said one surface of said substrate in a propagation path intersecting said reflecting surface defined by said discontinuity.

9. Electroacoustic apparatus comprising:

an acoustic substrate;

means for launching acoustic surface waves along a surface of said substrate along a propagation path;

a first acoustic discontinuity in and extending beneath said surface of said substrate spaced from said launching means and along said propagation path for reflecting part of said surface waves in said propagation path into a first reflection path along said surface;

means disposed in said first reflection path for detecting said surface waves reflected by said first acoustic discontinuity;

a second acoustic discontinuity in and extending beneath said surface of said substrate spaced further from said launching means than said first acoustic discontinuity and along said propagation path for reflecting part of said surface waves in said propagation path into a second reflection path along said surface;

means disposed in said second reflection path for detecting said surface waves reflected by said second acoustic discontinuity.

10. Electroacoustic apparatus comprising:

an acoustic substrate;

first means for launching acoustic surface waves in a first direction along a first propagation path and in a second direction along a second propagation path;

second means spaced from said launching means for reflecting substantially all of said surface waves in said first propagation path into a first reflection path;

third means spaced from said launching means for reflecting substantially all of said surface waves in said second propagation path into a second reflection path;

a first acoustic discontinuity in and extending beneath said surface of said substrate spaced from said second means for reflecting part of said surface waves in said first reflection path into a third reflection path;

means disposed in said third reflection path for detecting said surface waves reflected by said first acoustic discontinuity;

a second acoustic discontinuity in and extending beneath said surface of said substrate spaced from said third means for reflecting part of said surface waves in said second reflection path into a fourth reflection path;

means disposed in said fourth reflection path for detecting said surface waves reflected by said second acoustic discontinuity.

* * * * *